(12) United States Patent
Breil et al.

(10) Patent No.: US 12,284,803 B2
(45) Date of Patent: Apr. 22, 2025

(54) SYSTEM AND METHODS FOR DRAM CONTACT FORMATION

(71) Applicant: Applied Materials, Inc., Santa Clara, CA (US)

(72) Inventors: Nicolas Louis Breil, San Jose, CA (US); Fredrick Fishburn, Aptos, CA (US); Byeong Chan Lee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 546 days.

(21) Appl. No.: 17/688,602

(22) Filed: Mar. 7, 2022

(65) Prior Publication Data
US 2022/0336469 A1     Oct. 20, 2022

Related U.S. Application Data

(60) Provisional application No. 63/176,790, filed on Apr. 19, 2021.

(51) Int. Cl.
*H01L 27/108*     (2006.01)
*H10B 12/00*     (2023.01)

(52) U.S. Cl.
CPC .................................. *H10B 12/485* (2023.02)

(58) Field of Classification Search
CPC .... H10B 12/485; H10B 12/05; H10B 12/482; H01L 21/28518; H01L 21/28525; H01L 21/76849; H01L 21/76889
See application file for complete search history.

(56) References Cited

U.S. PATENT DOCUMENTS

| | | | |
|---|---|---|---|
| 10,529,602 B1 | 1/2020 | Panda | |
| 2002/0008324 A1 | 1/2002 | Shinkawata | |
| 2013/0181264 A1 | 7/2013 | Liao et al. | |
| 2019/0355806 A1* | 11/2019 | Kang | H01L 21/28556 |
| 2020/0020697 A1* | 1/2020 | Kim | H10B 12/485 |
| 2020/0373308 A1* | 11/2020 | Tsai | H10B 12/482 |
| 2021/0193457 A1* | 6/2021 | Park | H01L 28/65 |

FOREIGN PATENT DOCUMENTS

| | | |
|---|---|---|
| JP | 2006318991 A | 11/2006 |
| KR | 100331278 B1 | 4/2002 |

OTHER PUBLICATIONS

PCT International Search Report and Written Opinion dated Jun. 29, 2022, for International Application No. PCT/US2022/019180.

* cited by examiner

*Primary Examiner* — Mohammed R Alam
(74) *Attorney, Agent, or Firm* — Patterson + Sheridan, LLP

(57) ABSTRACT

The present disclosure generally relates to dynamic random access memory (DRAM) devices and to semiconductor fabrication for DRAM devices. Certain embodiments disclosed herein provide an integrated processing system and methods for forming CMOS contact, DRAM array bit line contact (BLC), and storage node structures. The integrated processing system and methods enable deposition of contact and storage node layers with reduced contamination and improved quality, thus reducing leakage current and resistance for the final contact and storage node structures.

20 Claims, 8 Drawing Sheets

SYSTEM AND METHODS FOR DRAM CONTACT FORMATION

CROSS-REFERENCE TO RELATED APPLICATIONS

This application claims priority to U.S. Provisional Application Ser. No. 63/176,790, filed Apr. 19, 2021, which is herein incorporated by reference in its entirety.

BACKGROUND

Field

Embodiments of the present disclosure generally relate to methods and apparatus for forming semiconductor device contacts and storage nodes, more specifically, to methods and apparatus for forming dynamic random access memory (DRAM) array bit line contacts (BLC) and storage nodes.

Description of the Related Art

Technology advances in semiconductor processing have resulted in integrated circuits reaching the physical limits of Moore's Law. These advances have resulted in new paradigms for devices and structures in integrated circuits. For example, various three-dimensional (3D) devices, such as 3D dynamic random access memory (DRAM), have been developed for integrated circuits. However, such 3D devices can result in a new set of challenges for processing and fabrication.

A key challenge in 3D DRAM design, manufacture, and operation is contact resistance (Rc). DRAM cells operate in arrays of columns (bit lines) and rows (word lines). The bit line propagates an electrical charge to and from a sense amplifier to program (write) or retrieve data from (read) a given cell. The speed at which data is written to and read from a DRAM cell depends on the resistance (R in Rc) of the bit line; the lower the resistance, the faster data is transferred. Resistance of a conductor depends on the scattering sites encountered by electrons as they move along the line. Impurities in the film, grain boundaries and surface roughness are some of the impediments that slow the electrons down. The formation of these impediments, and thus, the relative contribution thereof, is dependent upon film deposition methods and/or layer thicknesses.

Another key challenge for 3D DRAM devices includes contact stability. Generally, bit line contacts include very thin silicide layers that are subjected to high temperature processing after deposition. The downstream thermal processes may utilizes temperatures of about 1050° C. or more, which can cause degradation of the bit line contact silicide layer, such as agglomeration and nucleation thereof, which affects the overall performance of the bit line.

Therefore, there is a need in the art for improved contact and storage node structures with decreased contact resistance and improved thermal stability.

SUMMARY

Embodiments of the present disclosure generally relate to processing systems and methods for forming a contact.

In one embodiment, a method of forming a bit line contact within a dynamic random access memory (DRAM) device is provided. The method includes depositing a doped semiconductor layer over an exposed surface of a doped region of a substrate in a first chamber, wherein the doped region is exposed through a trench formed in a dielectric material over the doped region. A metal silicide layer is then deposited over the doped semiconductor layer and exposed to a nitridation process to form a nitride layer over the metal silicide layer. The formation of the semiconductor layer, the metal silicide layer, and the nitride layer are performed without breaking vacuum.

In another embodiment, a method of forming a bit line contact within a dynamic random access memory (DRAM) device is provided. The method includes pre-cleaning a substrate in a first chamber and depositing a doped semiconductor layer over an exposed surface of a doped region of the substrate in a second chamber, wherein the doped region is exposed through a trench formed in a dielectric material formed over the doped region. A metal silicide layer is deposited over the doped semiconductor layer in a third chamber and exposed to a nitridation process to form a nitride layer over the metal silicide layer. The method further includes depositing a conductive layer over the nitride layer in a fourth chamber, wherein the pre-cleaning and formation of the doped semiconductor layer, the metal silicide layer, the nitride layer, and the conductive layer are performed without breaking vacuum.

In yet another embodiment, a processing system is provided. The processing system includes a system controller and a first process chamber, wherein the system controller is configured to cause a pre-clean process to be performed on a doped region formed at a bottom of a trench formed in a dielectric layer formed on a substrate that is disposed in the first process chamber, and wherein the preclean process is performed on a doped region formed at a bottom of a trench formed in a dielectric layer. The processing system further includes a second process chamber, wherein the system controller is configured to cause a doped epitaxial layer and a metal silicide layer to be formed on the exposed surface of the doped region of the substrate that is disposed in the second process chamber, and a nitridation process to be performed on the metal silicide layer to form a nitride layer. The processing system also includes a third process chamber, wherein the system controller is configured cause a conductor layer to be formed over the nitride layer, wherein the processing system is configured to transfer the substrate between the first process, the second process chamber, and the third process chamber without breaking vacuum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments disclosed herein generally relate to dynamic random access memory (DRAM) devices and to semiconductor fabrication methods for such devices. For example, certain embodiments disclosed herein provide a processing system and methods for forming a DRAM array bit line contact (BLC) and storage node structure. Although described generally with reference to DRAM devices, the structures and methods disclosed herein may further be used to form other types of devices, such as complementary metal-oxide-semiconductor (CMOS) devices.

In various embodiments, the methods include performing various operations in a processing system without breaking vacuum. Such operations may include performing a pre-clean process on an exposed surface of a source/drain region of a transistor of a substrate, wherein the source/drain region is exposed through a trench formed in a dielectric material formed over the source/drain region. Such operations may further include forming an epitaxial layer over the exposed source/drain region via an epitaxial deposition process, wherein the epitaxial layer is doped or undoped. In certain embodiments, a metal silicide layer is formed over the epitaxial layer via a plasma enhanced deposition process, followed by in-situ nitridation to form a barrier or cap layer. In further embodiments, a metal layer is formed over the cap layer via, for example, a deposition process, and the substrate may thereafter be exposed to further processing.

The integrated process can form contact structures with reduced leakage current and resistance, as well as improved thermal stability. Embodiments disclosed herein may be useful for, but are not limited to, creating a DRAM bit line contact and/or DRAM storage node with decreased contact resistance, thus facilitating improved DRAM systems. Embodiments disclosed herein may also be useful for, but are not limited to, creating a CMOS source/drain contact.

As used herein, the term "about" refers to a +/−10% variation from the nominal value. It is to be understood that such a variation can be included in any value provided herein.

Figure 1:
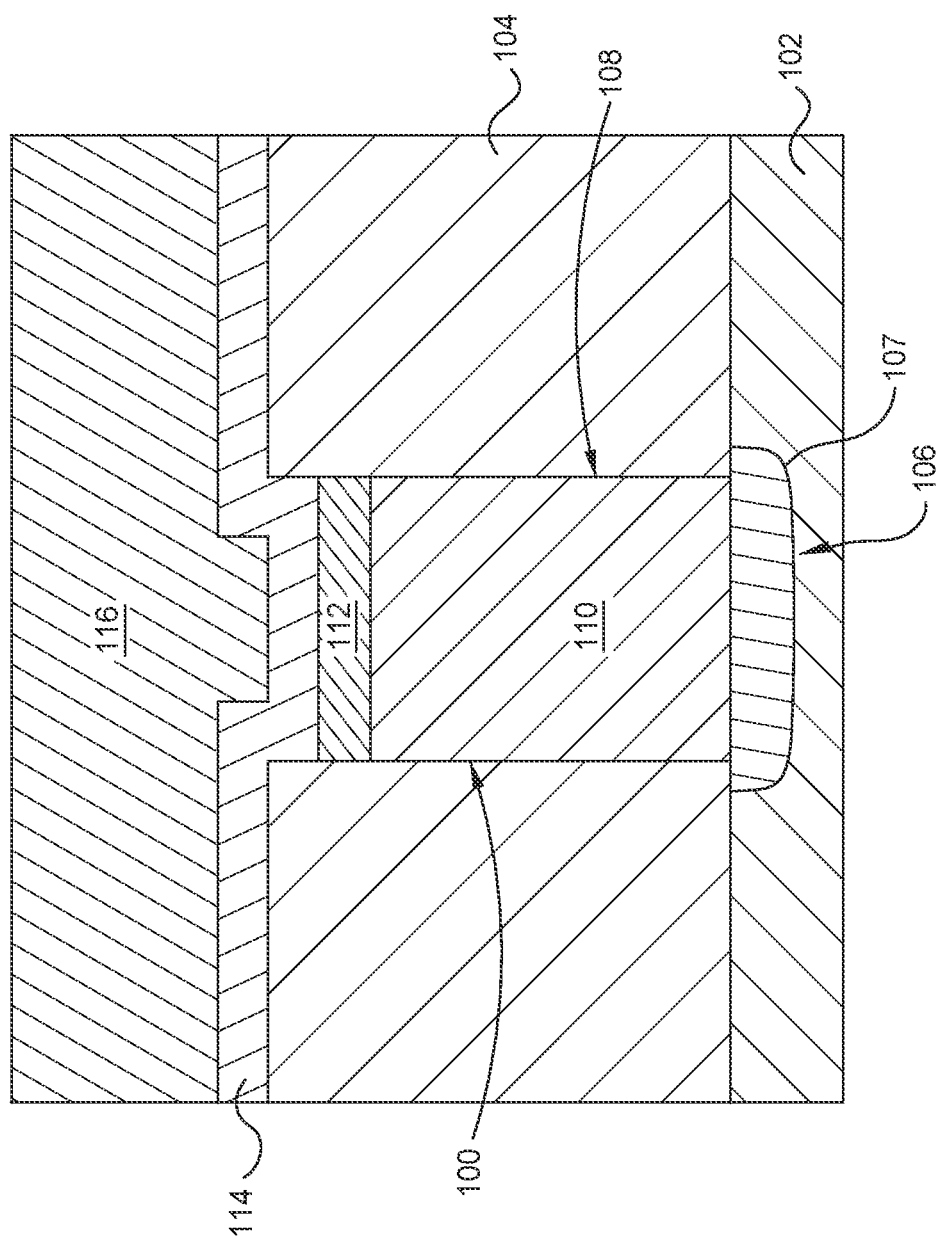
FIG. 1 is a cross-sectional view of a device contact, according to embodiments of the present disclosure.

FIG. 1 is a partial cross-sectional view of a device contact 100 along a length of a metal layer 116 formed thereon, according to embodiments described herein. In certain embodiments, the device contact 100 is a contact formed in a DRAM bit line structure. In certain embodiments, the device contact 100 is formed in a contact region of a DRAM bit line array, wherein the contact region can include a contact and any structures adjacent thereto, such as the source/drain region of a substrate. For example, the device contact 100 may be a bit line contact of a three-dimensional (3D) capacitor-over-bit-like structure. In certain embodiments, the device contact 100 is a contact for a source-drain region of a CMOS logic device, e.g., an NMOS or PMOS transistor.

The device contact 100 includes a spacer layer 104 formed over a substrate 102. Generally, the substrate 102 includes any suitable type of semiconductor substrate and materials. For example, the substrate 102 may include silicon (Si), germanium (Ge), silicon germanium (SiGe), or group III/V compound semiconductors, such as gallium arsenide (GaAs), indium gallium arsenide (InGaAs), or similar materials. In certain embodiments, the substrate 102 is a silicon-on-insulator (SOI) substrate.

The substrate 102 may be doped with a p-type or n-type dopant to form doped regions 106. In one embodiment, the substrate 102 is doped with an n-type dopant, such as phosphorus (P) or arsenic (As). In another embodiment, the substrate 102 is doped with a p-type dopant, such as boron (B). The doped regions 106 may form source/drain regions 107 of a transistor. In one example, the source/drain regions 107 are a source region or a drain region. In another example, the source/drain regions 107 include a merged source/drain region. In certain embodiments, the source/drain region 107 are grown epitaxially on the substrate 102.

The spacer layer 104 is formed over the substrate 102 and may be made of any suitable insulating material. For example, the spacer layer 104 may include an oxide, such as silicon dioxide ($SiO_2$), or a nitride, such as silicon nitride ($Si_3N_4$) and silicon carbonitride (SiCN), a combination thereof, or other dielectric materials. In certain examples, the spacer layer 104 includes tetraethyl orthosilicate (TEOS), phosphosilicate glass (PSG), borosilicate glass (BSG), or spin-on dielectrics (SOD). In certain embodiments, the spacer layer 104 is a single layer or a multi-layer. The spacer layer 104 may be formed by a deposition process, such as chemical vapor deposition (CVD), plasma enhanced CVD (PECVD) (e.g., high density plasma CVD (HDPCVD), and flowable CVD (FCVD), or other suitable methods.

One or more trenches 108 are formed through the spacer layer 104 such that the trenches 108 penetrate the spacer layer 104 and partially expose the substrate 102 and/or source/drain regions 107. The trenches 108 may be formed via any suitable patterning and material removal process, such as lithography and then a dry etch, wet etch, or combination of etching processes. Furthermore, the trenches 108 may have any suitable size and morphology. In certain examples, the trenches 108 have a substantially circular shape or substantially rectangular shape from a top view perspective (not shown).

An epitaxial layer 110 is formed within the trenches 108 and over the substrate 102. The epitaxial layer 110 is generally formed via a bottom-up growth process, such as a selective epitaxial growth (SEG) or deposition process. The epitaxial layer 110 of the device contact 100, though formed on a single substrate 102, may be formed at separate times and in separate epitaxial growth processes.

The epitaxial layer 110 may include any suitable silicon-containing semiconductor layer, such as a polysilicon epitaxial layer. In certain examples, the epitaxial layer 110 includes Si, SiC, SiGe, or similar materials. The epitaxial layer 110 may further be doped with a p-type or n-type dopant, thus forming a doped epitaxial layer. In certain examples, the epitaxial layer 110 is doped with an n-type dopant, such as phosphorus, arsenic, antimony, or similar materials. In certain examples, the epitaxial layer 110 is doped with carbon. Accordingly, in certain embodiments, the epitaxial layer 110 is a high strain in-situ phosphorus doped silicon (HS—Si:P) or phosphorus and carbon doped silicon (SiP:C) epitaxial layer. In certain embodiments, the epitaxial layer 110 has a phosphorus concentration of about $5 \times 10^{21}$ atoms/cm$^3$ or less, such as a phosphorous concentration of about $1 \times 10^{21}$ or less. In certain embodiments, the epitaxial layer 110 has a carbon concentration of about $5 \times 10^{21}$ or less, such as a carbon concentration of about $2.5 \times 10^{21}$ or less, such as a carbon concentration of about $5 \times 10^{20}$ or less. In certain embodiments, the epitaxial layer 110 includes a gradient dopant concentration of phosphorous and/or carbon along a height thereof.

As shown in FIG. 1 and FIG. 2, a metal silicide layer 112 is formed over the epitaxial layer 110. The metal silicide layer 112 may be formed by selectively depositing a metal layer over surfaces of the epitaxial layer 110 and/or on exposed surfaces of source/drain regions 107 and, in certain embodiments, thereafter annealing. In certain embodiments, the metal silicide layer 112 is directly deposited on the epitaxial layer 110 and/or the source/drain region 107, but not on the spacer layer 104 (e.g., via selective epitaxial deposition). The metal silicide layer 112 may be a refractory metal layer formed using a CVD process, PECVD process, HDPCVD process, PVD process, plating process, sputtering process, evaporation process, epitaxial deposition process, selective epitaxial deposition process, or any suitable process. In certain embodiments, the metal silicide layer 112 includes titanium (Ti) silicide, cobalt (Co) silicide, nickel (Ni) silicide, ruthenium (Ru) silicide, tantalum (Ta) silicide, tungsten (W) silicide, molybdenum (Mo) silicide, alloys thereof, other suitable metal silicides, or any combinations thereof. Additional examples of the metals for the metal silicide layer 112 include, but are not limited to, TiSi, RuSi, nickel platinum (NiPt) alloy, nickel palladium (NiPd), nickel rhenium (NiRe), titanium tantalum (TiTa), or titanium niobium (TiNb).

In certain embodiments, the metal silicide layer 112 is formed in the same process chamber as the epitaxial layer 110. In certain embodiments, the metal silicide layer 112 is formed in a different process chamber than the epitaxial layer 110, but the same processing system. In certain examples, the metal silicide layer 112 is formed in an epitaxial deposition chamber of the processing system. Because the epitaxial layer 110 and the metal silicide layer 112 are formed in the same processing system, there is no vacuum break between the processes.

A cap layer 114 is formed over the device contact 100, e.g., over the metal silicide layer 112 and the spacer layer 104. In certain embodiments, the cap layer 114 is formed by use of a conformal deposition process that allows the cap layer 114 to form along sidewalls of the spacer layer 104, thus forming a lined trench therein. The cap layer 114 acts as a barrier layer that prevents metal from a subsequently formed metal layer, e.g., the metal layer 116, from diffusing and reacting with the underlying metal silicide layer 112 and/or the source/drain region 107. The cap layer 114 may also serve as an adhesion layer to improve adhesion between the subsequent metal layer and the metal silicide layer 112. In certain embodiments, the cap layer 114 is a nitride layer. For example, the cap layer 114 can include, but is not limited to, TiN, Si$_3$N$_4$, or a metal silicon nitride. The cap layer 114 may include a metallic material containing a transition metal, such as iridium (Ir) or molybdenum (Mo). In certain embodiments, the cap layer 114 is a nitride layer, such as a TiN layer, formed by a physical vapor deposition (PVD) process, an atomic layer deposition (ALD) or chemical vapor deposition (CVD) process, or a nitridation process. The nitridation process can include exposing the metal silicide layer 112 to a nitrogen-containing plasma or a nitrogen-containing ambient environment so that nitrogen (N) atoms chemically react with atoms residing at the exposed surface of the metal silicide layer 112 to form a surface nitride layer (e.g., the cap layer 114).

The metal layer 116 is formed over surfaces of the cap layer 114 and may serve as the bit line and/or storage node conductor metal. Examples of suitable materials for the metal layer 116 include, but are not limited to, W, Co, Cu, Al, Ru, Ti, Ag, platinum (Pt) palladium (Pa), alloys thereof, derivatives thereof, or any combinations thereof. The metal layer 116 may be deposited over the cap layer 114 using one or more deposition processes, such as a CVD process, a PECVD process, an atomic layer deposition (ALD) process, a plasma-enhanced ALD (PEALD) process, a physical vapor deposition (PVD) process, an electroless plating process, an electroplating (ECP) process, or other suitable deposition methods.

Figure 2A:
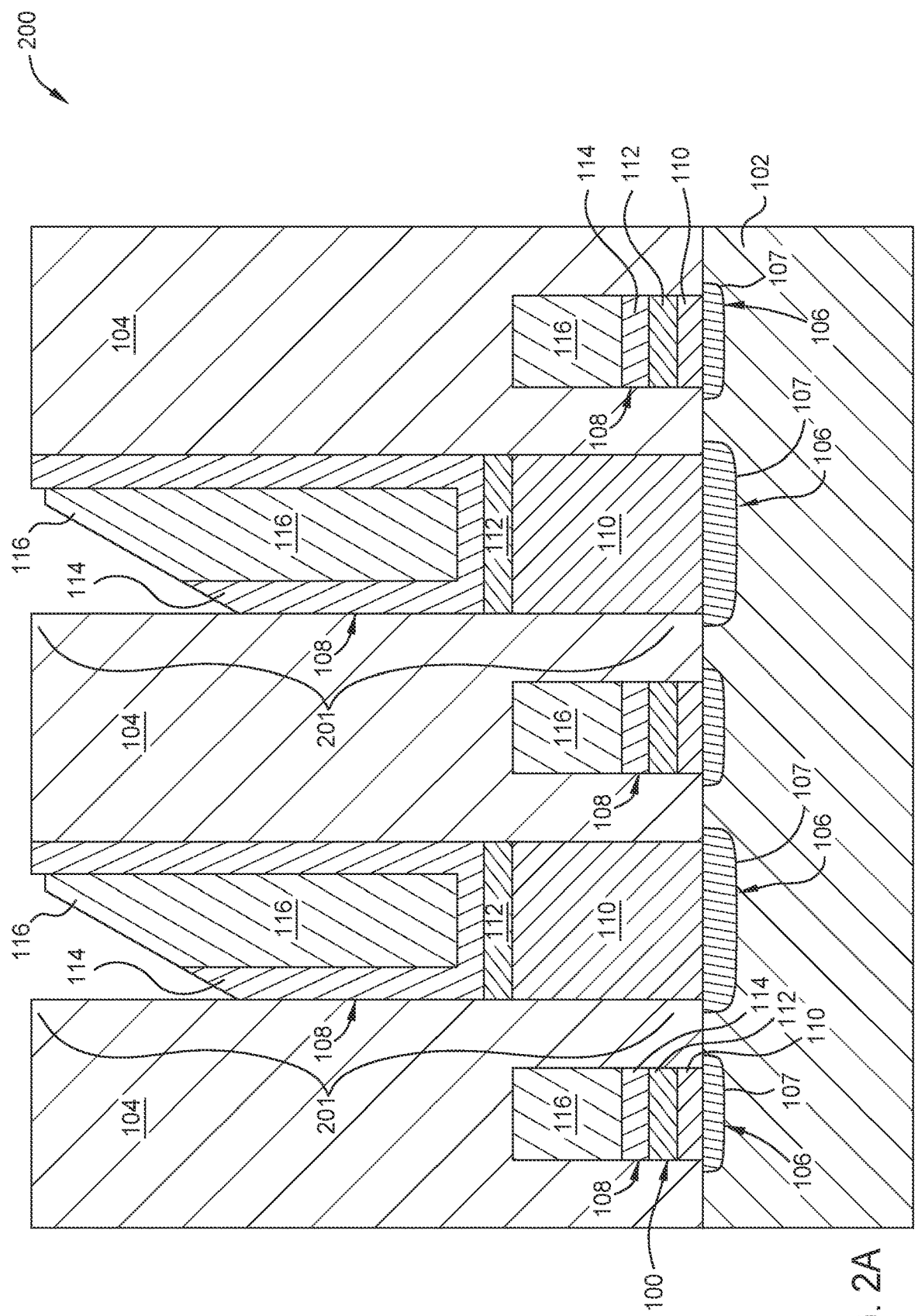
FIGS. 2A-2C are cross-sectional views of device contacts in various devices, according to embodiments of the present disclosure.

FIG. 2A is a partial cross-sectional view of a DRAM system 200 that includes at least a portion of the device contact 100 of FIG. 1, as viewed in a plane that is perpendicular to the plane shown in FIG. 1 (e.g., across metal layer 116a, which is a bit line in FIG. 2A), according to embodiments described herein. In certain embodiments, the DRAM system 200 is a 3D DRAM structure including a plurality of device contacts 100 and a plurality of storage nodes 201 disposed in an alternating arrangement. For example, the DRAM system 200 may be a 3D capacitor-over-bit-type structure.

As shown in FIG. 2A, each of the contact devices 100, or "contact plugs," are formed over a source/drain region 107 and have the metal layer 116, which acts as a bit line, formed thereover. The storage nodes 201 may have a substantially similar structure to the device contacts 100 but for the size thereof and thus, may be formed by substantially similar methods. For purpose of reference, bit line contact structures, such as device contacts 100 in FIG. 2A, may have cross-sectional dimensions of about 10 nm×4 nm, or about 8 nm×4 nm.

Figure 2B:
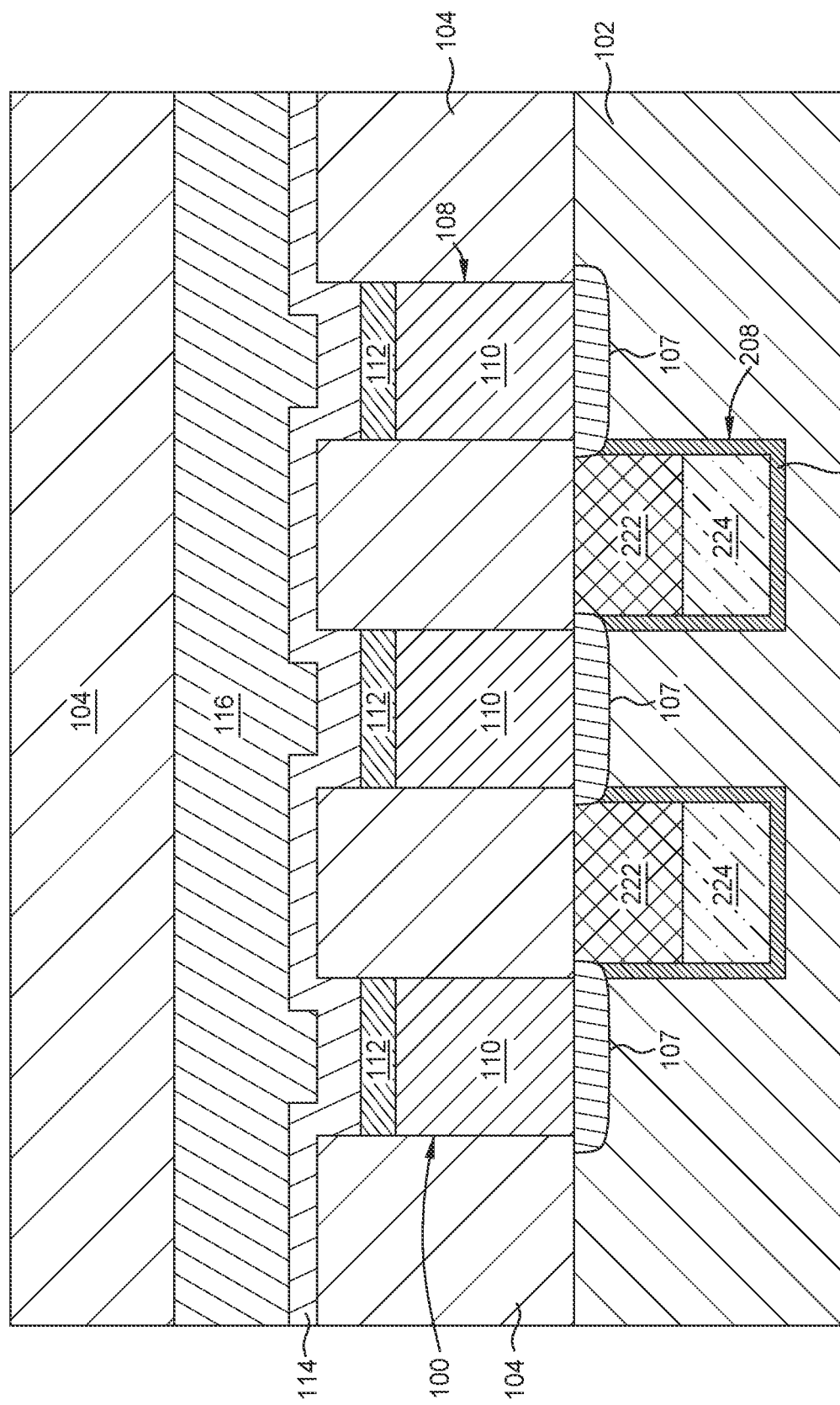

FIG. 2B is a partial cross-sectional view of the DRAM system 200 of FIG. 2A, as viewed in the same plane as shown in FIG. 1 (e.g., in a plane perpendicular to the plane shown in FIG. 2A and along the metal layer 116, which is a bit line). As shown in FIG. 2B, the DRAM system 200 includes a plurality of contact devices 100 having bit lines formed thereon, as well as buried word lines 224 disposed between the contact devices 100. Each buried word line 224 is disposed in a channel 208 formed in the substrate 102 between two source/drain regions 107, which are formed below the contact devices 100. The buried word lines 224 partially fill the channels 208, which are lined by an insulation layer 226 that is conformally formed over internal surfaces thereof. A sealing layer 222 may further be formed over the buried word line 224 and any remaining exposed surfaces of the insulation layer 226 such that the sealing layer 206 has an upper surface planar with an upper surface of the substrate 102.

Similar to the metal layer 116, the buried world line 224 may be formed of any suitable low-resistance metal materials. In certain embodiments, the buried word line 224 is formed of W, Co, Cu, Al, Ru, Ti, Ag, platinum (Pt) palladium (Pa), alloys thereof, derivatives thereof, or any combinations thereof. The sealing layer 222 and/or the insulating layer 226 may be formed of any suitable insulating materials. For example, the sealing layer 222 and/or the insulating layer 226 may include an oxide, such as silicon dioxide ($SiO_2$), or a nitride, such as silicon nitride ($Si_3N_4$) and silicon carbonitride (SiCN), a combination thereof, or other dielectric materials. In certain examples, the sealing layer 222 and/or the insulating layer 226 include tetraethyl orthosilicate (TEOS), phosphosilicate glass (PSG), borosilicate glass (BSG), or spin-on dielectrics (SOD). In certain embodiments, the insulating layer 226 is a single layer or a multi-layer.

Figure 2C:
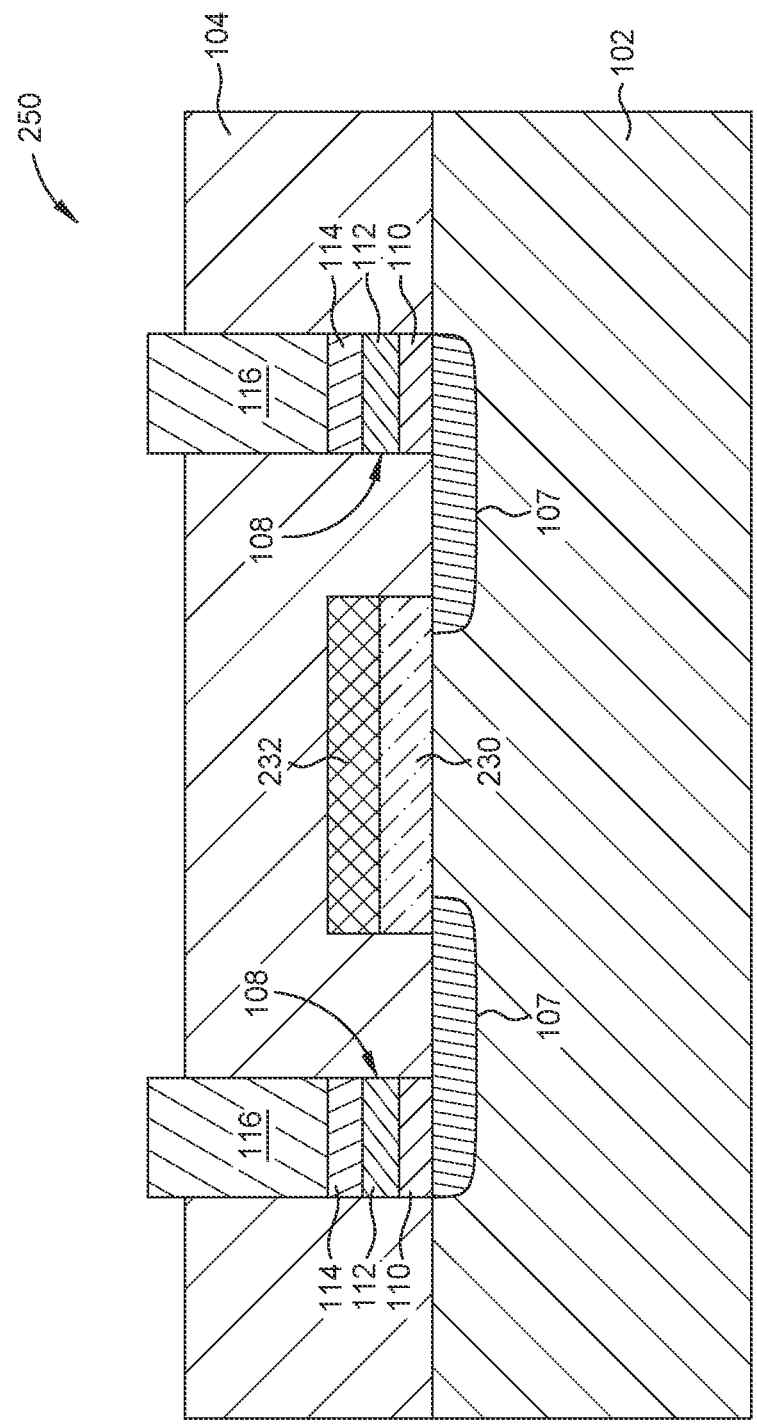

FIG. 2C is a partial cross-sectional view of a portion of a CMOS device 250 that includes at least a portion of the device contact 100 of FIG. 1, according to embodiments described herein. The CMOS device 250 will include suitable MOSFET device elements, such as a PMOS transistor and an NMOS transistor. The portion of the CMOS device 250 illustrated in FIG. 2C is formed on the substrate 102, and includes a gate 232, insulating layer 230, and at least two source/drain regions 107 formed in the substrate 102. In FIG. 2C, the device contacts 100 serve as contacts for the source/drain regions 107 of the MOSFET device. Thus, each device contact 100 (two are shown in FIG. 2C) is formed over at least a portion of a source/drain region 107 and on either side of a transistor gate 232.

In some embodiments, the device contacts 100 of at least one of the MOSFET devices in the CMOS device 250 are formed simultaneously with device contacts and/or storage nodes of other devices or systems, including the device contacts 100 and/or storage nodes 201 of the DRAM system 200. For example, the source/drain regions 107, device contacts 100, and contact regions of the CMOS device 250 may be formed simultaneously and peripherally to the DRAM system 200, e.g., on the same substrate 102. In certain examples, device contacts 100 of the CMOS device 250 and DRAM system 200 are formed in or through the spacer layer 104 on the same substrate 102. In such embodiments, the device contacts 100 of the CMOS device 250 may include an epitaxial layer 110 doped with carbon, and in certain examples, only carbon, in order to improve thermal stability of the metal silicide layer 112 thereof. In certain other examples, the device contacts 100 of the CMOS device 250 may be formed in or through a separate spacer layer on the same substrate 102 (e.g., a spacer layer other than spacer layer 104 on the substrate 102).

Figure 3:
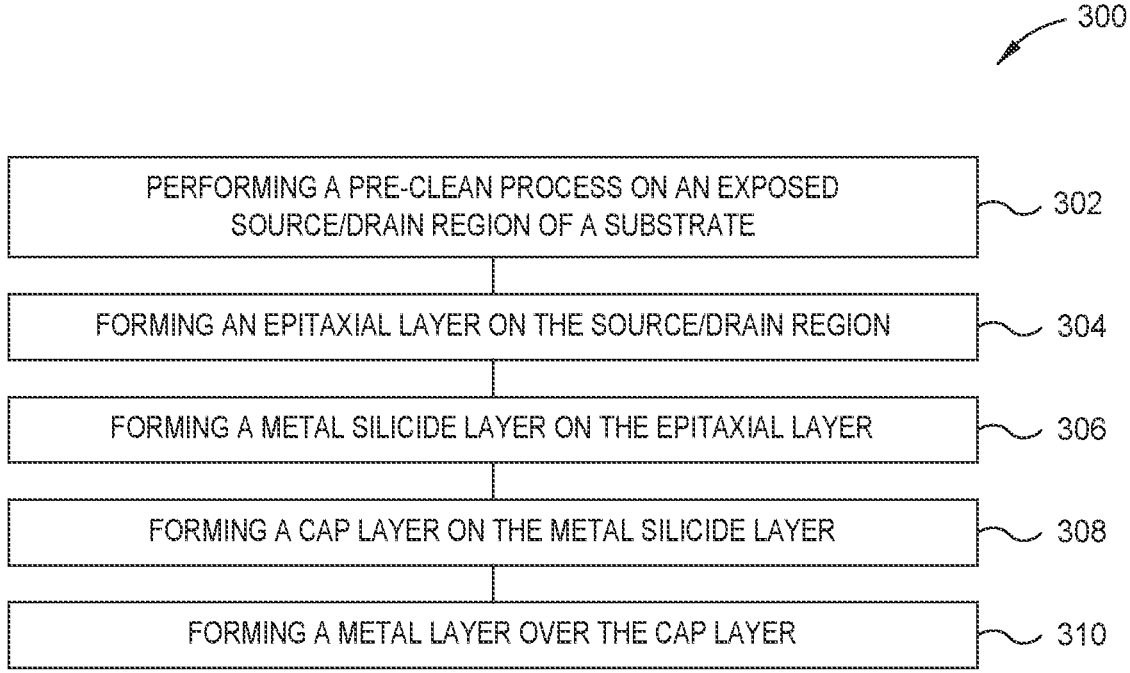
FIG. 3 is a flow diagram of a method for forming a device contact, according to embodiments of the present disclosure.

FIG. 3 is a flow diagram of a method 300 for forming a contact structure, such as the device contact 100, and/or a storage node, such as DRAM storage node 201, according to embodiments described herein. FIGS. 4A-4E illustrate various views of the device contact 100 during different operations of the method 300, according to certain embodiments. Therefore, FIG. 3 and FIGS. 4A-4E are herein described together for clarity.

Although the method 300 operations are described in conjunction with FIGS. 3 and 4A-4E, persons skilled in the art will understand that any system configured to perform the method operations, in any order, falls within the scope of the embodiments described herein. Furthermore, although FIGS. 4A-4E illustrate the method 300 as applied to the formation of the device contact 100, persons skilled in the art will understand that the method 300 may also be utilized to form the DRAM storage node 201. It is further noted that the method 300 can be utilized to form any other semiconductor structures not presented herein. Those skilled in the art should recognize that a full process for forming a semiconductor device and the associated structures are not illustrated in the drawings or described herein. The contact can be part of a DRAM bit line structure, storage node, transistor (e.g., nMOS-type transistor), CMOS device, or other semiconductor device.

Figure 4B:
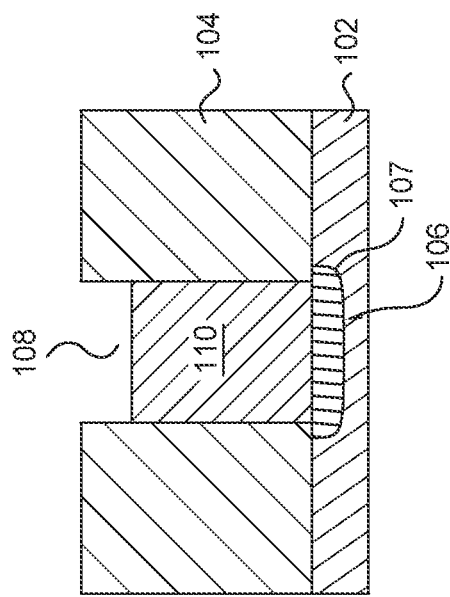
FIGS. 4A-4E illustrate the device contact of FIG. 1 at various operations of the method of FIG. 3, according to embodiments of the present disclosure.
Figure 4A:
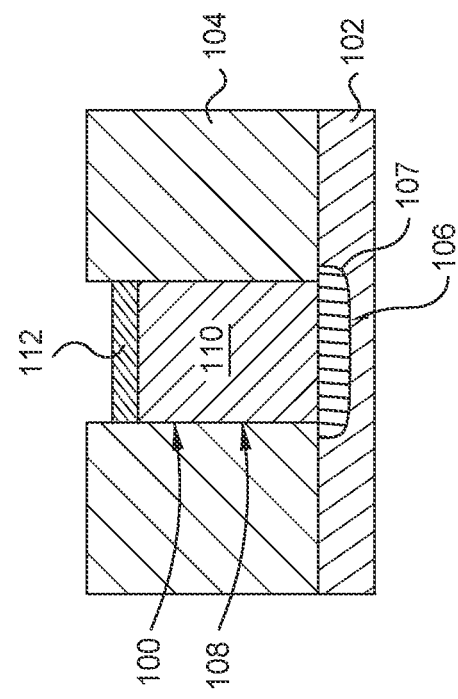

The method 300 begins at operation 302 and FIG. 4A, wherein the substrate 102 having a patterned spacer layer 104 formed thereon is optionally exposed to one or more pre-clean processes in one or more process chambers of a processing system. As described above, the substrate 102 may include any suitable type of semiconductor substrate and materials, such as Si, Ge, SiGe, group III/V compound semiconductors, or similar materials. In certain embodiments, the substrate 102 includes the doped region 106, which may form the source/drain region 107 of a transistor. The spacer layer 104 is formed over the substrate 102 and includes any suitable type of insulating material. The spacer layer 104 may be formed by a deposition process (not shown), such as a CVD process, in the same or different process chamber and/or processing system as the one or more pre-clean processes of operation 302.

As shown in FIG. 4A, a trench 108 is formed in the spacer layer 104 such that a portion of the surface of the doped region 106 of the substrate 102 is exposed. The trench 108 may be formed by any suitable removal process (not shown), such as an etch process using a mask pattern (not shown), in the same or different process chamber and/or processing system as the one or more pre-clean processes of operation 302. In certain embodiments, the removal process is a chemical dry etch process, a wet etch process, or a combination thereof. In certain embodiments, a dry etch process is utilized in a process chamber to form the trench 108 in the spacer layer 104.

The one or more pre-clean processes at operation 302 may include a wet cleaning process or a dry cleaning process. In certain embodiments, the one or more pre-clean processes are performed in one or more vacuum process chambers using a remote plasma source. For example, the one or more pre-clean processes may include exposing the substrate 102 to a hydrogen- ($H_2$) and/or chlorine- ($Cl_2$) based plasma, and/or a nitrogen-based plasma, such as a nitrogen trifluoride ($NF_3$) and/or ammonia ($NH_3$) plasma. In other examples, the one or more pre-clean processes may include exposing the substrate 102 to an inert gas containing plasma in a first process chamber of a processing system. The one or more pre-clean processes may remove native oxides and/or carbon from the substrate 102, as well as any damaged layers thereon.

Examples of a suitable first process chamber for performing pre-clean processes include an AKTIV Pre-Clean™ chamber of SiCoNi™ clean chamber available from Applied Materials, Inc., Santa Clara, California. In certain other examples, pre-cleaning may be performed in an etch chamber, such as an etch chamber using an inductively coupled plasma (ICP) source. One example of an etch chamber is a modified Decoupled Plasma Source (DPS) etch chamber that is available form Applied Materials, Inc., Santa Clara, California. However, it is further contemplated that other suitably configured chambers from other manufacturers can also be implemented to perform the pre-cleaning processes described herein.

At operation 304 and FIG. 4B, the epitaxial layer 110 is formed in the trench 108 to fill a portion thereof. The epitaxial layer 110 includes any suitable silicon-containing material and may be formed by a bottom-up growth process, such as a selective epitaxial deposition process. For example, the epitaxial layer 110 may be formed via CVD, PECVD, low pressure CVD (LPCVD), very low pressure CVD (VLPCVD), ultrahigh vacuum CVD (UHVCVD), rapid thermal CVD (RTCVD), atomic pressure CVD (APCVD) molecular beam epitaxy (MBE), or similar processes.

The epitaxial layer 110 may further be doped via an in-situ doping process. For example, the in-situ doping process may be performed by supplying a dopant gas while the silicon-containing epitaxial layer 110 is being grown using a silicon source gas. In certain embodiments, the epitaxial layer 110 is a high strain Si layer doped in-situ with phosphorus and/or carbon. In such embodiments, the epitaxial deposition and dopant soak process may be performed at a temperature range between about 450° C. and about 550° C., such as about 500° C., and a pressure range between about 10 Torr and about 80 Torr, such as between about 30 Torr and about 60 Torr, such as about 50 Torr.

In certain embodiments, the doping process includes flowing a phosphorus-based gas, such as phosphine ($PH_3$), into the process chamber at a flow rate between about 500 sccm and about 1500 sccm, such as between about 750 sccm and about 1250 sccm, such as between about 900 sccm and about 1100 sccm, such as about 1000 sccm. In certain embodiments, the doping process includes flowing a carbon-based gas into the process chamber at a flow rate between about 30 sccm and about 200 sccm, such as between about 50 sccm and about 150 sccm, such as between about 75 sccm and about 125 sccm, such as about 100 sccm. In certain embodiments, a silicon source gas, such as silane ($SiH_4$), disilane ($Si_2H_6$), trisilane ($Si_3H_8$), tetra-silane ($Si_4H_{10}$), dichlorosilane ($SiH_2Cl_2$) or combinations thereof, is flowed into the process chamber at a flow rate between about 50 sccm and about 200 sccm, such as between about 75 sccm and about 175 sccm, such as between about 100 sccm and about 150 sccm, such as about 125 sccm. In certain embodiments, hydrogen chloride (HCl) gas is flowed into the process chamber at a flow rate between about 50 sccm and about 500 sccm, such as between about 100 sccm and about 400 sccm, such as between about 200 sccm and about 300 sccm, such as about 250 sccm. In one example, an epitaxial silicon layer deposition process is performed on a substrate at a deposition pressure of 40 Torr, while tetra-silane ($Si_4H_{10}$) is flowed at 11 sccm, and a hydrogen containing carrier gas is flowed at 5 SLM for about 712 seconds at a temperature of 450° C.

In further embodiments, the epitaxial layer 110 may include a SiGe layer doped with an N-type dopant, or a SiC layer doped with an N-type dopant.

The epitaxial deposition and doping process may be performed in a second process chamber of the processing system described herein. One example of a suitable chamber is a reduced pressure (RP) Epi chamber available from Applied Materials, Inc., Santa Clara, California. However, it is further contemplated that other suitably configured chambers from other manufacturers can also be implemented to perform the deposition processes described herein.

Figure 4C:
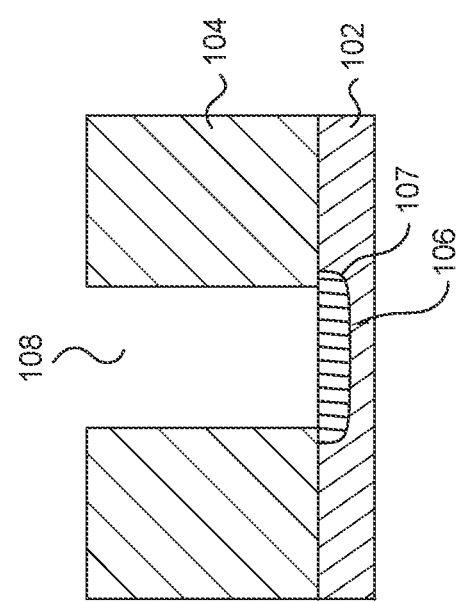

At operation 306 and FIG. 4C, the metal silicide layer 112 is formed over the epitaxial layer 110 and/or over exposed surfaces of the source/drain region 107. In certain embodiments, the metal silicide layer 112 is conformally formed over the epitaxial layer 110 and/or over exposed surfaces of the source/drain region 107 such that it partially fills the trench 108. The metal silicide layer 112 may be a silicidable and refractory metal layer formed using an ALD process, CVD process, PECVD process, HDPCVD process, PVD process, plating process, sputtering process, evaporation process, or any suitable process followed by annealing to cause a silicide reaction. In certain embodiments, the metal silicide layer 112 is a Ti layer deposited by PECVD and thereafter annealed.

In certain embodiments, the metal silicide layer 112 is formed by a CVD process or epitaxial deposition process without annealing. For example, the metal silicide layer 112 may be formed on the epitaxial layer 110 and/or the source/drain regions 107 of the substrate 102, but not on the spacer layer 104, as a result of a selective epitaxial deposition process. The metal silicide layer 112 can include titanium silicide, cobalt silicide, ruthenium silicide, tungsten silicide, molybdenum silicide, combinations thereof, or other suitable metal silicides.

In certain embodiments, the deposition of the metal silicide layer 112 is performed in the same chamber as the formation of the epitaxial layer 110, such as the second chamber of the processing system described herein. In certain other embodiments, the metal silicide layer 112 is deposited in a third process chamber. Accordingly, the metal silicide layer 112 may be formed in-situ over the epitaxial layer 110. By performing operations 302-306 in-situ, interface contamination between the substrate 102, epitaxial layer 110, and metal silicide layer 112 may be greatly reduced, thus reducing overall resistance of the final device contact 100 and improving thermal stability.

In certain embodiments, an annealing process is performed on the deposited metal silicide layer 112 in the second process chamber, the third process chamber, or a fourth process chamber of the processing system described herein. In certain embodiments, the third or fourth process chamber is a rapid thermal annealing (RTA) chamber. One example of a suitable RTA chamber is a Vantage® RADOX™ RTP chamber available from Applied Materials, Inc., Santa Clara, California. However, it is further contemplated that other suitably configured chambers from other manufacturers can also be implemented to perform the deposition processes described herein.

Figure 4E:
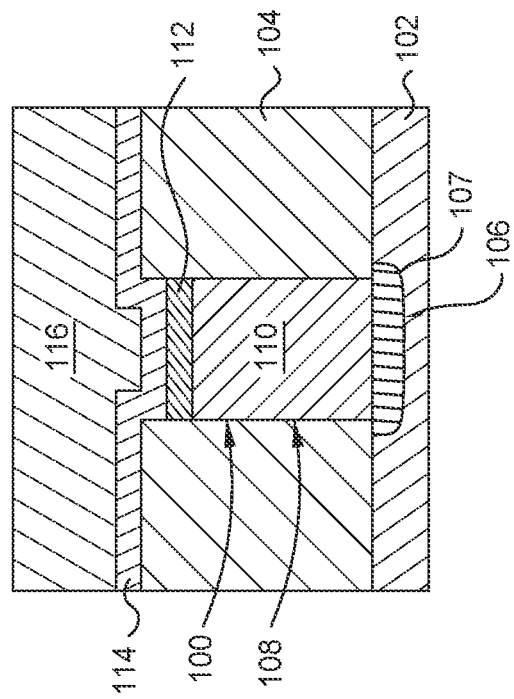
Figure 4D:
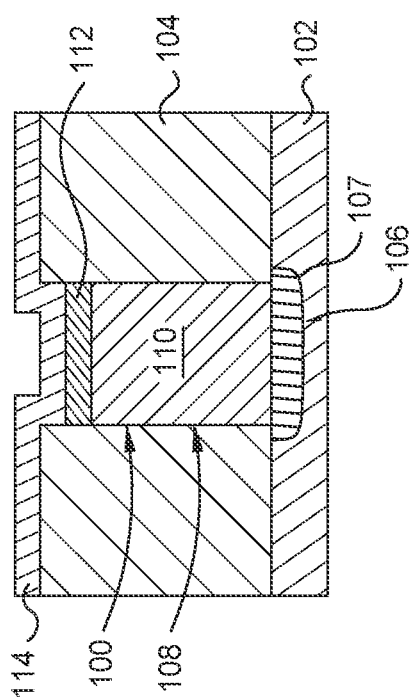

The cap layer 114 is formed over the device contact 100, e.g., the metal silicide layer 112 and the spacer layer 104, at operation 308 and FIG. 4D. At this point, the device contact 100 may be referred to as a "contact plug." In certain embodiments, the cap layer 114 is a nitride layer formed by a nitridation process. The nitridation process can be performed in the same or different chamber as the formation of the metal silicide layer 112 and/or epitaxial layer 110. For example, the nitridation process may be performed in-situ along with the deposition of the epitaxial layer 110 and the metal silicide layer 112 in the second process chamber or the third process chamber, thus further reducing interface contamination within the device contact 100. The nitridation process at operation 308 provides improved thermal stability to the metal silicide layer 112, thus reducing the likelihood of degradation and/or oxidation thereof during subsequent processing with high thermal budgets. Generally, the cap layer 114 may have a thickness of about 5 nm or less, such as a thickness of about 2 nm or less.

In certain embodiments, the nitridation process is a plasma nitridation process utilizing a nitrogen ($N_2$) gas, hydrogen ($H_2$) gas, and/or an argon (Ar) gas mixture. In certain embodiments, the plasma nitridation process is performed using an RF power between about 100 W and about 1000 W, and at a pressure between about 5 Torr and about 50 Torr.

At operation 310 and FIG. 4E, the metal layer 116 is formed over the cap layer 114. The metal layer 116 is formed over surfaces of the cap layer 114 and may serve as a bit line conductor metal, which may be referred to simply as the bit line. In certain embodiments, a seed layer (not shown) and/or a barrier layer (not shown) are formed between the cap layer 114 and the metal layer 116, which may include similar or different materials to the metal layer 116.

Examples of suitable materials for the metal layer 116 include, but are not limited to, W, Co, Cu, Al, Ru, Ti, Ag, Pt, Pa, alloys thereof, derivatives thereof, or any combinations thereof. The metal layer 116 may be deposited over the cap layer 114 using one or more deposition processes, such as a CVD process, PECVD process, ALD process, PEALD process, PVD process, plating process, ECP process, or other suitable deposition methods. The formation of the metal layer 116 may be performed in the third process chamber, the fourth process chamber, or a fifth process chamber of the processing system. In certain embodiments, the metal layer 116 is formed in a CVD chamber. One example of a suitable CVD chamber is a Volta™ CVD chamber available from Applied Materials, Inc., Santa Clara, California. However, it is further contemplated that other suitably configured chambers from other manufacturers can also be implemented to perform the deposition processes described herein.

After formation of the metal layer 116, the device contact 100 can be subjected to further processes that are used to complete a CMOS device and/or a DRAM device, such as a DRAM bit line array.

Examples of a processing system that can be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) can be adapted to benefit from aspects described herein.

Figure 5:
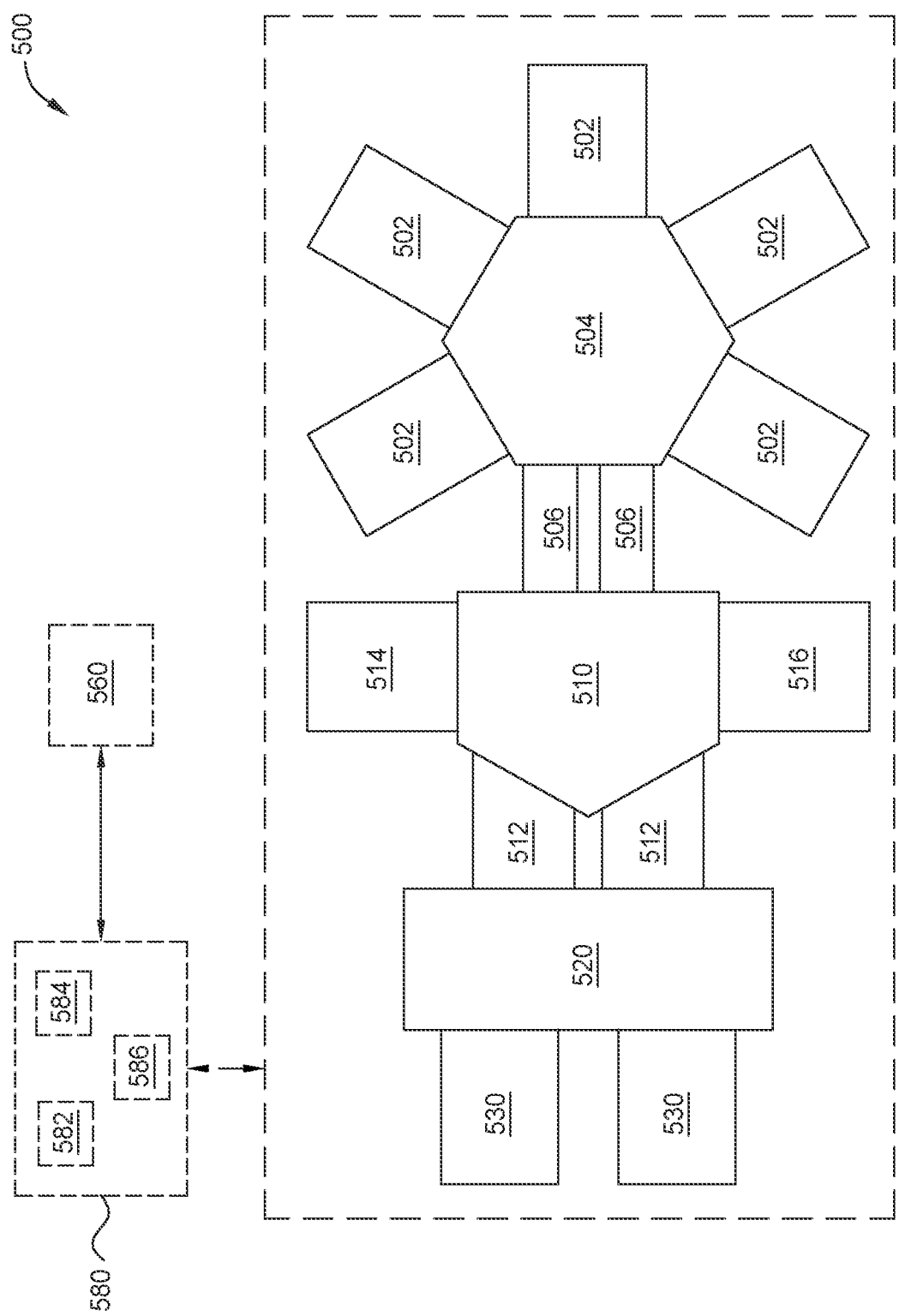
FIG. 5 illustrates a schematic top-view diagram of a multi-chamber processing system for performing the method of FIG. 3, according to embodiments of the present disclosure.

FIG. 5 illustrates a schematic top-view diagram of a multi-chamber processing system 500, according to one embodiment. The multi-chamber processing system 500 is configured to perform a variety of semiconductor processing methods on one or more substrates, such as method 300 described above. As shown, the multi-chamber processing system 500 includes a plurality of process chambers 502, 514, 516, a first transfer chamber 504, pass-through chambers 506, a second transfer chamber 510, load lock chambers 512, a factory interface 520, one or more pods 530, and a system controller 580.

Each of the process chambers 502 is coupled to the first transfer chamber 504. The first transfer chamber 504 is also coupled to the first pair of pass-through chambers 506. The first transfer chamber 504 has a centrally disposed transfer robot (not shown) for transferring substrates between the pass-through chambers 506 and the process chambers 502. The pass-through chambers 506 are coupled to the second transfer chamber 510, which is coupled to the process chambers 514 and 516, which are configured to perform pre-clean processing (operation 302) and/or optionally an annealing process. The second transfer chamber 510 has a centrally disposed transfer robot (not shown) for transferring substrates between the load lock chambers 512, the pass-through chambers 506, and the process chamber 514 and/or the process chamber 516. The factory interface 520 is connected to the second transfer chamber 510 by the load lock chambers 512. The factory interface 520 is coupled to the one or more pods 530 on the opposite side of the load lock chambers 512. The pods 530 typically are front opening unified pods (FOUP) that are accessible from a clean room.

In certain embodiments, a substrate is transferred from the pods 530 to the process chamber 514 and/or process chamber 516, where pre-clean processing (e.g., operation 302) is performed to remove contaminants, such as carbon or oxide contaminants, from exposed surfaces of a source/drain region of a transistor of the substrate. Thereafter, the substrate is transferred to the one or more process chambers 502, in which an epitaxial layer is deposited (e.g., operation 304, such as SEG of SiCP or SiP), a silicide layer is deposited (e.g., operation 306, such as PECVD of Ti or Mo), an optional cap layer is formed (e.g., operation 308, such as nitridation of the Ti layer to form TiN), and a metal layer are deposited (e.g., operation 310, such as CVD of W). Because all these operations 302-310 are performed within the same processing system, vacuum is not broken as the substrate is transferred to the various chambers, which decreases the chance of contamination and improves the quality of the deposited epitaxial films, thus reducing contact resistance of any formed contact structures.

A system controller 580 is coupled to the processing system 500. The system controller 580 controls the processing system 500 or components thereof. For example, the system controller 580 controls the operations of the processing system using a direct control of the chambers 502, 504, 506, 510, 512, 514, 516 and/or factory interface 520 and/or pod 530 of the processing system 500, or by controlling controllers associated with the chambers 502, 504, 506, 510, 512, 514, 515 and/or factory interface 520 and/or pod 530. In operation, the system controller 580 enables data collection and feedback from the respective chambers to coordinate performance of the processing system 500.

As shown, the system controller 580 includes a central processing unit (CPU) 582, memory 584, and support circuits 586. The CPU 582 can be one of any form of a general-purpose processor that is used in an industrial setting. The memory 584 can include non-transitory computer-readable medium and/or machine-readable storage device. The memory 584 is accessible by the CPU 582 and can be one or more of memory such as random access memory (RAM), read only memory (ROM), floppy disk, hard disk, or any other form of digital storage, local or remote. The support circuits 586 are coupled to the CPU 582 and can include cache, clock circuits, input/output subsystems, power supplies, and the like. The system controller 580 is configured to perform method 300 operations stored in the memory 584. The various embodiments disclosed in this disclosure can generally be implemented under the control of the CPU 582 by executing computer instruction code stored in the memory 584 (or in memory of a particular process chamber) as, e.g., a computer program product or software routine. That is, the computer program product is tangibly embodied on the memory 584 (or non-transitory computer-readable medium or machine-readable storage device). When the computer instruction code is executed by the CPU 582, the CPU 582 controls the chambers to perform operations in accordance with the various embodiments.

As described above, methods of forming a semiconductor device contact and a processing system are provided herein. In certain aspects, the methods and system provided herein can be used to form dynamic random access memory (DRAM) array bit line contacts (BLC), storage nodes, and CMOS device contacts having reduced thicknesses.

The processing system includes a plurality of process chambers configured to clean, deposit, etch, and/or anneal a substrate upon which the semiconductor device contact structure is formed. The chambers are integrated into a single integrated system, which was previously found to be challenging due to the high sensitivity of epitaxy chambers to contamination. Integrating at least an epitaxy chamber with a metal deposition chamber has enabled various operations of the presently described contact formation methods to be performed within the same processing system. Accordingly, vacuum is not broken while the substrate is transferred between various process chambers, which decreases the chance of interfacial contamination and improves the quality of the deposited layers. Furthermore, the processing system and methods provide for a heavily nitrided metal silicide layer, which improves the thermal stability thereof and reduces degradation during subsequent thermal processing. As a result, the integrated process described herein can form contact structures with reduced resistance.

EXAMPLE EMBODIMENTS

Embodiment 1: A method of forming a device contact, comprising: depositing a doped semiconductor layer over an exposed surface of a first doped region of a substrate in a first chamber, wherein the first doped region is exposed through a trench formed in a dielectric material formed over the first doped region; depositing a metal silicide layer over the doped semiconductor layer; and exposing the metal silicide layer to a nitridation process to form a nitride layer over the metal silicide layer, wherein the semiconductor layer, the metal silicide layer, and the nitride layer are formed without breaking vacuum, and wherein the doped semiconductor layer and the metal silicide layer form a bit line contact plug of a dynamic random access memory (DRAM) device, the DRAM device comprising: a word line formed between the first doped region and a second doped region of the substrate; and a bit line formed over the bit line contact plug.

Embodiment 2: The method of Embodiment 1 above, wherein the doped semiconductor layer is a high strain in-situ phosphorus doped silicon (HS—Si:P) layer or a phosphorus and carbon doped silicon (SiP:C) layer.

Embodiment 3: The method of Embodiment 2 above, wherein the semiconductor layer has a phosphorus concentration of about $1\times10^{21}$ atoms/cm$^3$ or less.

Embodiment 4: The method of Embodiment 1 above, wherein the metal silicide layer is deposited in the first chamber via a chemical vapor deposition (CVD) process, plasma enhanced CVD (PECVD) process, high density plasma CVD (HDPCVD) process, physical vapor deposition (PVD) process, plating process, sputtering process, or evaporation process.

Embodiment 5: The method of Embodiment 4 above, wherein the metal silicide layer comprises titanium (Ti), cobalt (Co), nickel (Ni), ruthenium (Ru), tantalum (Ta), tungsten (W), molybdenum (Mo), or alloys thereof.

Embodiment 6: The method of Embodiment 1, wherein the nitride layer is a titanium nitride (TiN) layer.

Embodiment 7: The method of Embodiment 1, further comprising: pre-cleaning the substrate in a second chamber prior to depositing the doped semiconductor layer, wherein the pre-cleaning and formation of the doped semiconductor layer, the metal silicide layer, and the nitride layer are performed without breaking vacuum.

Embodiment 8: The method of Embodiment 1, further comprising: depositing a conductive layer over the nitride layer in a second chamber, wherein formation of the doped semiconductor layer, the metal silicide layer, the nitride layer, and the conductive layer are performed without breaking vacuum, and wherein the conductive layer forms the bit line over the bit line contact plug.

Embodiment 9: The method of Embodiment 8, wherein the conductive layer is deposited via a chemical vapor deposition (CVD) process, plasma enhanced CVD (PECVD) process, physical vapor deposition (PVD) process, atomic layer deposition (ALD) process, or plasma-enhanced ALD (PEALD) process.

Embodiment 10: The method of Embodiment 9, wherein the conductive layer comprises tungsten (W), cobalt (Co), copper (Cu), aluminum (Al), titanium (Ti), silver (Ag), platinum (Pt) palladium (Pa), or alloys thereof.

Embodiment 11: A method of forming a device contact, comprising: pre-cleaning a substrate in a first chamber; depositing a doped semiconductor layer over exposed surfaces of a plurality of doped regions of the substrate in a second chamber, wherein the doped regions are exposed through trenches formed in a dielectric material formed over the plurality of doped regions; depositing a metal silicide layer over the doped semiconductor layer in a third chamber, wherein the doped semiconductor layer and the metal silicide layer form a bit line contact plug for a dynamic random access memory (DRAM) device; exposing the metal silicide layer to a nitridation process to form a nitride layer over the metal silicide layer; and depositing a conductive layer over the nitride layer in a fourth chamber, the conductive layer forming a bit line over the bit line contact plug, wherein the pre-cleaning and formation of the doped semiconductor layer, the metal silicide layer, the nitride layer, and the conductive layer are performed without breaking vacuum, and wherein the DRAM device further comprises: a word line is disposed within a portion of the substrate and formed between a first doped region and a second doped region of the plurality of doped regions.

Embodiment 12: The method of Embodiment 11, wherein the doped semiconductor layer is a high strain in-situ phosphorus doped silicon (HS—Si:P) layer or a phosphorus and carbon doped silicon (SiP:C) layer.

Embodiment 13: The method of Embodiment 12, wherein the semiconductor layer has a phosphorus concentration of about $1\times10^{21}$ atoms/cm$^3$ or less.

Embodiment 14: The method of Embodiment 11, wherein the metal silicide layer is deposited via a chemical vapor deposition (CVD) process, plasma enhanced CVD (PECVD) process, high density plasma CVD (HDPCVD) process, physical vapor deposition (PVD) process, plating process, sputtering process, or evaporation process.

Embodiment 15: The method of Embodiment 14, wherein the metal silicide layer comprises titanium (Ti), cobalt (Co), nickel (Ni), ruthenium (Ru), tantalum (Ta), tungsten (W), molybdenum (Mo), or alloys thereof.

Embodiment 16: The method of Embodiment 11, wherein the nitride layer is a titanium nitride (TiN) layer.

Embodiment 17: A processing system comprising: a system controller; a first process chamber, wherein the system controller is configured to cause a pre-clean process to be performed on a doped region at a bottom of a trench formed in a dielectric layer over a substrate; a second process chamber, wherein the system controller is configured to cause: a doped epitaxial layer and a metal silicide layer to be formed on the exposed surface of the doped region of the substrate, the doped epitaxial layer and the metal silicide layer forming a bit line contact plug of a dynamic random access memory (DRAM) device; and a nitridation process to be performed on the metal silicide layer to form a nitride layer; and a third process chamber, wherein the system controller is configured cause a conductor layer to be formed over the nitride layer, the conductor layer forming a bit line over the bit line contact plug, wherein the processing system is configured to transfer the substrate between the first process, the second process chamber, and the third process chamber without breaking vacuum.

Embodiment 18: The processing system of Embodiment 17, wherein the doped epitaxial layer is a high strain in-situ phosphorus doped silicon (HS—Si:P) layer or a phosphorus and carbon doped silicon (SiP:C) layer.

Embodiment 19: The processing system of Embodiment 17, wherein the doped epitaxial layer has a phosphorus concentration of about $1\times10^{21}$ atoms/cm$^3$ or less.

Embodiment 20: The processing system of Embodiment 17, wherein the metal silicide layer comprises titanium (Ti), cobalt (Co), nickel (Ni), ruthenium (Ru), tantalum (Ta), tungsten (W), molybdenum (Mo), or alloys thereof.

Embodiment 21: A processing system comprising: a transfer chamber; a plurality of process chambers coupled to the transfer chamber; and a system controller configured to cause a process to be performed in the process system that includes: performing a pre-clean process on a substrate; forming a doped epitaxial semiconductor layer on a doped region on the substrate; forming a metal silicide layer on the doped epitaxial semiconductor layer; exposing the metal silicide layer to a nitridation process to form a nitride layer over the metal silicide layer; and depositing a conductive layer over the nitride layer, wherein the pre-cleaning and the formation of the doped epitaxial semiconductor layer, the metal silicide layer, the nitride layer are performed without breaking vacuum.

Embodiment 22: The processing system of Embodiment 21, wherein the doped epitaxial semiconductor layer is a high strain in-situ phosphorus doped silicon (HS—Si:P) layer or a phosphorus and carbon doped silicon (SiP:C) layer, and wherein the metal silicide layer comprises titanium (Ti), cobalt (Co), nickel (Ni), ruthenium (Ru), tantalum (Ta), tungsten (W), molybdenum (Mo), or alloys thereof.

Embodiment 23: The processing system of Embodiment 22, wherein the doped epitaxial semiconductor layer has a phosphorus concentration of about $1\times10^{21}$ atoms/cm$^3$ or less.

While the foregoing is directed to embodiments of the present disclosure, other and further embodiments of the disclosure may be devised without departing from the basic scope thereof, and the scope thereof is determined by the claims that follow.

What is claimed is:

1. A method of forming a dynamic random access memory (DRAM) device, comprising:
   forming a plurality of bit line contact regions in an array on the DRAM device, wherein forming each of the bit line contact regions comprises:
      forming a plurality of source/drain contact regions;
      depositing a doped semiconductor layer on a first doped region while depositing the doped semiconductor layer on each of the source/drain contact regions, the first doped region exposed through a trench in a dielectric material formed over the first doped region on a substrate;
      depositing a metal silicide layer over the doped semiconductor layer; and
      forming a nitride layer over the metal silicide layer, wherein the doped semiconductor layer, the metal silicide layer, and the nitride layer are formed in a single processing system without breaking vacuum, the single process system including a plurality of process chambers,
   wherein the doped semiconductor layer comprises a silicon layer doped with carbon only, the carbon having a concentration of about $5\times10^{21}$ atoms/cm$^3$ or less.

2. A method of forming a dynamic random access memory (DRAM) device, comprising:
   forming a plurality of bit line contact regions in an array on the DRAM device, wherein forming each of the bit line contact regions comprises:
      depositing a doped semiconductor layer on a first doped region, the first doped region exposed through a trench in a dielectric material formed over the first doped region on a substrate;
      depositing a metal silicide layer over the doped semiconductor layer; and
      forming a nitride layer over the metal silicide layer, wherein the doped semiconductor layer, the metal silicide layer, and the nitride layer are formed in a single processing system without breaking vacuum, the single process system including a plurality of process chambers,
   wherein the doped semiconductor layer comprises a silicon layer doped with phosphorus and carbon, the phosphorus having a concentration of about $5\times10^{21}$ atoms/cm$^3$ or less and the carbon having a concentration of about $5\times10^{21}$ atoms/cm$^3$ or less.

3. The method of claim 1, wherein the doped semiconductor layer is deposited by an epitaxial deposition process.

4. The method of claim 1, wherein:
   the metal silicide layer is deposited by a chemical vapor deposition (CVD) process, plasma enhanced CVD (PECVD) process, high density plasma CVD (HDPCVD) process, physical vapor deposition (PVD) process, plating process, sputtering process, or evaporation process, and
   the metal silicide layer comprises at least one of titanium (Ti), cobalt (Co), nickel (Ni), ruthenium (Ru), tantalum (Ta), molybdenum (Mo), and tungsten (W).

5. The method of claim 1, further comprising:
   exposing the first doped region to a pre-clean process prior to depositing the doped semiconductor layer, wherein the pre-clean process and the formation of the doped semiconductor layer, the metal silicide layer, and the nitride layer are performed in the single processing system without breaking vacuum; and
   depositing a conductive layer over the nitride layer, wherein the conductive layer forms a bit line over the bit line contact region.

6. The method of claim 5, wherein the formation of the doped semiconductor layer, the metal silicide layer, the nitride layer, and the conductive layer are performed in the single processing system without breaking vacuum.

7. The method of claim 1, wherein the nitride layer is formed by exposing the metal silicide layer to a nitridation process.

8. A method of forming a dynamic random access memory (DRAM) device, comprising:
   forming a plurality of bit line contact regions in an array on the DRAM device, wherein forming each of the bit line contact regions comprises:
      exposing a first doped region to a pre-clean process in a first chamber, the first doped region exposed through a trench formed in a dielectric material formed over the first doped region on a substrate;
      depositing a doped semiconductor layer on the first doped region in a second chamber;
      depositing a metal silicide layer over the doped semiconductor layer in a third chamber;
      exposing the metal silicide layer to a nitridation process to form a nitride layer over the metal silicide layer; and
      depositing a conductive layer over the nitride layer in a fourth chamber, wherein the pre-clean process and the formation of the doped semiconductor layer, the metal silicide layer, the nitride layer are performed without breaking vacuum.

9. The method of claim 8, wherein the pre-clean process and the formation of the doped semiconductor layer, the metal silicide layer, the nitride layer and the conductive layer are performed without breaking vacuum.

10. The method of claim 9, wherein the doped semiconductor layer is a high strain in-situ phosphorus doped silicon (HS—Si:P) layer or a phosphorus and carbon doped silicon (SiP:C) layer.

11. The method of claim 10, wherein the semiconductor layer has a phosphorus concentration of about $1 \times 10^{21}$ atoms/cm$^3$ or less.

12. The method of claim 8, wherein the metal silicide layer is deposited via a chemical vapor deposition (CVD) process, plasma enhanced CVD (PECVD) process, high density plasma CVD (HDPCVD) process, physical vapor deposition (PVD) process, plating process, sputtering process, or evaporation process.

13. The method of claim 12, wherein the metal silicide layer comprises titanium (Ti), cobalt (Co), nickel (Ni), ruthenium (Ru), tantalum (Ta), tungsten (W), molybdenum (Mo), or alloys thereof.

14. The method of claim 10, wherein the doped semiconductor layer is deposited by an epitaxial deposition process.

15. A processing system comprising:
a transfer chamber;
a plurality of process chambers coupled to the transfer chamber; and
a system controller configured to cause a process to be performed in the process system that includes:
exposing a first doped region to a pre-clean process in a first chamber, the first doped region exposed through a trench formed in a dielectric material formed over the first doped region on a substrate;
depositing a doped semiconductor layer on the first doped region in a second chamber;
depositing a metal silicide layer over the doped semiconductor layer in a third chamber;
exposing the metal silicide layer to a nitridation process to form a nitride layer over the metal silicide layer; and
depositing a conductive layer over the nitride layer in a fourth chamber, wherein the pre-clean process and the formation of the doped semiconductor layer, the metal silicide layer, the nitride layer are performed without breaking vacuum.

16. The processing system of claim 15, wherein the doped semiconductor layer is a high strain in-situ phosphorus doped silicon (HS—Si:P) layer or a phosphorus and carbon doped silicon (SiP:C) layer.

17. The method of claim 2, wherein the doped semiconductor layer is deposited by an epitaxial deposition process.

18. The method of claim 2, wherein:
the metal silicide layer is deposited by a chemical vapor deposition (CVD) process, plasma enhanced CVD (PECVD) process, high density plasma CVD (HDPCVD) process, physical vapor deposition (PVD) process, plating process, sputtering process, or evaporation process, and
the metal silicide layer comprises at least one of titanium (Ti), cobalt (Co), nickel (Ni), ruthenium (Ru), tantalum (Ta), molybdenum (Mo), and tungsten (W).

19. The method of claim 2, further comprising:
exposing the first doped region to a pre-clean process prior to depositing the doped semiconductor layer, wherein the pre-clean process and the formation of the doped semiconductor layer, the metal silicide layer, and the nitride layer are performed in the single processing system without breaking vacuum.

20. The method of claim 19, further comprising:
depositing a conductive layer over the nitride layer, wherein the conductive layer forms a bit line over the bit line contact region,
wherein the formation of the doped semiconductor layer, the metal silicide layer, the nitride layer, and the conductive layer are performed in the single processing system without breaking vacuum.

* * * * *